US007015151B2

(12) United States Patent
Powell

(10) Patent No.: US 7,015,151 B2
(45) **Date of Patent: *Mar. 21, 2006**

(54) TRANSISTOR FABRICATION METHODS COMPRISING SELECTIVE WET OXIDATION

(75) Inventor: Don Carl Powell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/089,714

(22) Filed: Mar. 24, 2005

(65) Prior Publication Data

US 2005/0170623 A1 Aug. 4, 2005

Related U.S. Application Data

(63) Continuation of application No. 10/375,721, filed on Feb. 25, 2003, now Pat. No. 6,890,867.

(51) Int. Cl.
*H01L 21/31* (2006.01)
*H01L 21/469* (2006.01)

(52) U.S. Cl. ....................................... 438/770; 438/775

(58) Field of Classification Search ................ 438/770, 438/775
See application file for complete search history.

(56) References Cited

U.S. PATENT DOCUMENTS 5,040,046 A 8/1991 Chhabra et al.
6,093,661 A 7/2000 Trivedi et al.
6,114,259 A 9/2000 Sukharev et al.
6,265,297 B1 7/2001 Powell
6,348,380 B1 2/2002 Weimer et al.
6,358,788 B1 3/2002 Chen et al.
6,372,657 B1 4/2002 Hineman et al.
6,375,194 B1 4/2002 Peng
6,403,497 B1 6/2002 Oka et al.
6,423,617 B1 7/2002 Powell
6,440,382 B1 8/2002 Powell
6,455,906 B1 9/2002 Chen et al.
6,458,714 B1 10/2002 Powell et al.
6,468,854 B1 10/2002 Agarwal
6,471,780 B1 10/2002 Mercaldi et al.
6,472,264 B1 10/2002 Agarwal
6,479,340 B1 11/2002 Agarwal
6,489,194 B1 12/2002 Agarwal
6,537,677 B1 3/2003 Mercaldi et al.

(Continued)

OTHER PUBLICATIONS

Y. Hiura et al., *Integration Technorology of Polymetal(W/WSiN/Poly-Si) Dual Gate CMOS for 1 Gbit DRAMs and Beyond*, IEEE, p. 14.5.1-14.5.4 (1998).

(Continued)

*Primary Examiner*—Michael Lebentritt
*Assistant Examiner*—Ron Pompey
(74) *Attorney, Agent, or Firm*—Wells St. John P.S.

(57) ABSTRACT

A transistor gate is formed which comprises semiconductive material and conductive metal. Source/drain regions are formed proximate the transistor gate. In one implementation, the transistor gate and source/drain regions are exposed to a gas mixture comprising $H_2O$, $H_2$, a noble gas and $N_2$ under conditions effective to oxidize outer surfaces of the source/drain regions. The $N_2$ is present in the gas mixture at greater than 0% and less than or equal to 20.0% by volume. In one implementation, the transistor gate and source/drain regions are exposed to a gas mixture comprising $H_2O$, $H_2$, and an inert gas under conditions effective to oxidize outer surfaces of the source/drain regions. The conditions comprise a pressure of greater than room ambient pressure. Other aspects and implementations are contemplated.

26 Claims, 1 Drawing Sheet

U.S. PATENT DOCUMENTS

| | | | | |
|---|---|---|---|---|
| 6,555,487 | B1 | 4/2003 | Weimer et al. | |
| 6,569,781 | B1 | 5/2003 | Dokumaci et al. | |
| 6,576,979 | B1 | 6/2003 | Weimer et al. | |
| 6,592,777 | B1 | 7/2003 | Chen et al. | |
| 6,607,975 | B1 | 8/2003 | Agarwal | |
| 6,617,624 | B1 | 9/2003 | Powell | |
| 6,620,742 | B1 | 9/2003 | Powell | |
| 6,649,278 | B1 | 11/2003 | Mercaldi et al. | |
| 6,686,275 | B1 | 2/2004 | Chen et al. | |
| 6,693,354 | B1 | 2/2004 | Chen et al. | |
| 6,703,303 | B1 | 3/2004 | Chen et al. | |
| 6,720,215 | B1 | 4/2004 | Agarwal | |
| 6,730,584 | B1 | 5/2004 | Schuegraf et al. | |
| 6,734,531 | B1 | 5/2004 | Weimer et al. | |
| 6,743,720 | B1 | 6/2004 | Chen et al. | |
| 6,744,102 | B1 | 6/2004 | Trivedi et al. | |
| 6,784,124 | B1 | 8/2004 | Weimer et al. | |
| 2002/0195683 | A1 * | 12/2002 | Kim et al. .................. | 257/532 |
| 2005/0014391 | A1 * | 1/2005 | Shioya et al. ............... | 438/789 |

OTHER PUBLICATIONS

Koji Kawada et al., *Water Vapor Generator by Catalytic Reactor*, pp. 10-16 (pre-May 1999).

Byung Hak Lee et al., *In-situ Barrier Formation for High Reliable W/barrier/polySi Gate Using Denudation of WN, on Polycrystalline Si*, IEEE, pp. 14.4.1-14.4.4 (1998).

Toshiaki Nagahama et al., *Wet Hydrogen Oxidation System for Metal Gate LSI's,* pp. 140-143 (pre-May/1999).

Kazuhiro Ohnishi et al., *Improving gate oxide integrity (GOI) of a W/WNx/dual-poly Si stacked-gate by using Wet-Hydrogen oxidation in 0.14-μm CMOS devices*, IEEE, 4 pages (1998).

Hitoshi Wakabayashi et al., *An Ultra-Low Resistance and Thermal Stable W/pn-Poly-Si Gate CMOS Technology using Si/TiN Buffer Layer*, IEEE, pp. 14.6.1-14.6.4 (1998).

* cited by examiner

TRANSISTOR FABRICATION METHODS COMPRISING SELECTIVE WET OXIDATION

RELATED PATENT DATA

This patent resulted from a continuation application of U.S. patent application Ser. No. 10/375,721, filed Feb. 25, 2003 now U.S. Pat. No. 6,890,867, entitled "Transistor Fabrication Methods", naming Don Carl Powell as inventor, the disclosure of which is incorporated by reference.

BACKGROUND OF THE INVENTION

One type of circuitry device is a field effect transistor. Typically, such includes opposing semiconductive material source/drain regions of one conductivity type having a semiconductive channel region of opposite conductivity type therebetween. A gate construction is received proximate the channel region, typically between the source/drain regions. The gate construction typically includes a conductive region having a thin dielectric layer positioned between the conductive region and the channel region. Current can be caused to flow between the source/drain regions through the channel region by applying a suitable voltage to the conductive portion of the gate.

Typical transistor fabrication methods include a step referred to as source/drain re-oxidation. Such may be conducted for any of a number of reasons depending upon the materials, sequence and manner by which transistor components have been fabricated prior to the re-oxidation step. For example, one method of providing a gate dielectric layer is to thermally grow an oxide over a bulk or semiconductor-on-insulator substrate. In certain instances, source/drain regions are provided by conducting ion implantation through this oxide layer after the gate construction has been patterned to at least partially form the source/drain regions. The heavy source/drain implant is likely to damage and contaminate the oxide remaining over the source/drain regions. Even if all the oxide were removed over the source/drain regions prior to the implant, damage to the crystal lattice and the source/drain outer surface typically occurs from the source/drain implant(s). Accordingly and regardless, a re-oxidation step is conducted to grow a fresh, uncontaminated oxide on the source/drain regions towards repairing certain damage caused by the implant. This typically occurs after any remaining damaged oxide has been stripped from over the source/drain regions.

Typically, this re-oxidation also grows a very thin thermal oxide on tops and sidewalls of the conductive components of the gate construction. Further, it tends to slightly thicken the gate oxide under the gate corners, and thereby round the lower outer edges of the typical polysilicon material of the gate. The ion implantation and any oxide stripping can weaken or mechanically compromise the gate oxide at the sidewall edges of the gate, and tend to increase the field effect transistor gate-to-drain overlap capacitance. The thickening and rounding of the gate oxide at the corners can reduce gate-to-drain overlap capacitance, and relieve the electric-field intensity at the corner of the gate structure, thus enhancing the gate oxide integrity at its edge. Further, the thermal oxide can serve as a dopant diffusion mask preventing dopant diffusion from subsequently deposited insulative interlevel dielectric layers.

Numerous thermal re-oxidation processes exist. The invention is directed to transistor fabrication methods involving oxidation of the outer surfaces of source/drain regions.

SUMMARY

The invention includes transistor fabrication methods. In one implementation, a transistor gate is formed which comprises semiconductive material and conductive metal. Source/drain regions are formed proximate the transistor gate. The transistor gate and source/drain regions are exposed to a gas mixture comprising $H_2O$, $H_2$, a noble gas and $N_2$ under conditions effective to oxidize outer surfaces of the source/drain regions. The $N_2$ is present in the gas mixture at greater than 0% and less than or equal to 20.0% by volume.

In one implementation, the transistor gate and source/drain regions are exposed to a gas mixture comprising $H_2O$, $H_2$, and an inert gas under conditions effective to oxidize outer surfaces of the source/drain regions. The conditions comprise a pressure of greater than room ambient pressure.

In one implementation, the transistor gate and source/drain regions are exposed to a gas mixture comprising $H_2O$, $H_2$, and an inert gas under conditions effective to oxidize outer surfaces of the source/drain regions at an oxide forming reaction rate of at least 0.20 Angstroms/minute where a volumetric ratio of all inert gas to $H_2$ is at least 10:1.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
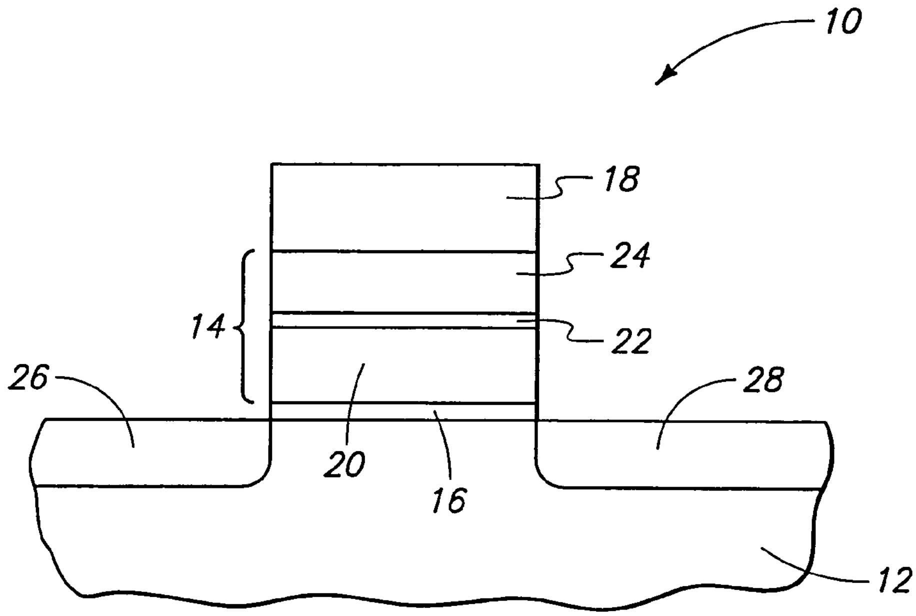
FIG. 1 is a diagrammatic sectional view of an exemplary substrate fragment at a processing step in accordance with an aspect of the invention.
Figure 2:
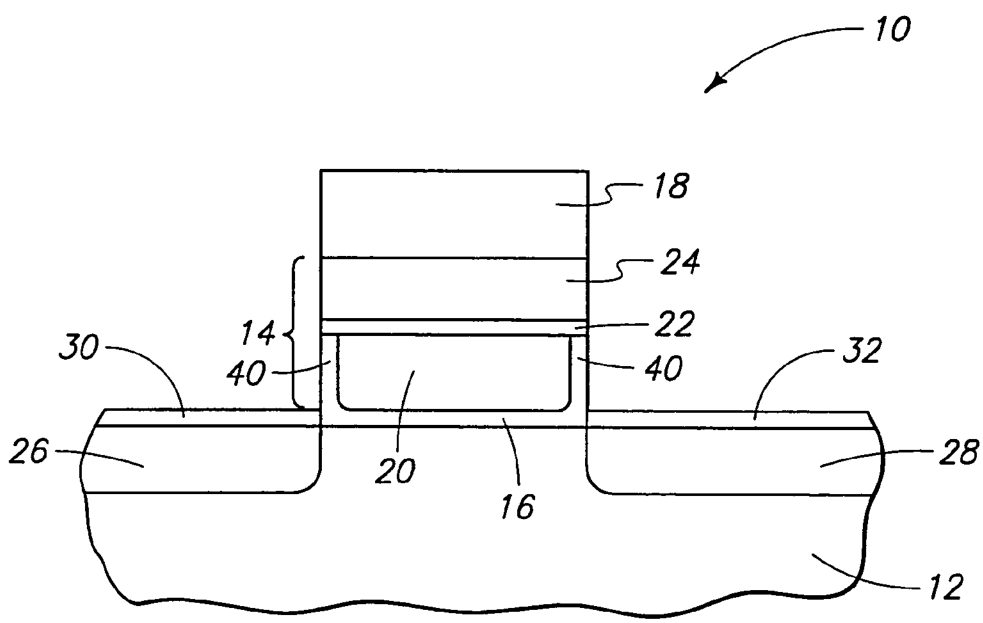
FIG. 2 is a view of the FIG. 1 substrate at a processing step subsequent to that shown by FIG. 1.

Preferred embodiment methods of fabricating a transistor are described with reference to FIGS. 1 and 2. Referring initially to FIG. 1, a semiconductor substrate is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated. Substrate 10 comprises an exemplary bulk substrate material 12, for example monocrystalline silicon. Of course, other materials and substrates are contemplated, including semiconductor-on-insulator and other substrates whether existing or yet-to-be developed.

A transistor gate construction 10 is formed over substrate 12. By way of example only, such includes a conductive transistor gate 14 sandwiched between a pair of dielectric layers 16 and 18. Dielectric layer 16 serves as a gate dielectric, with a preferred exemplary material being thermally grown silicon dioxide having a thickness of from 25 Angstroms to 70 Angstroms. Typically, insulative layer 18 serves as an insulative cap, with exemplary preferred materials being silicon nitride and/or undoped silicon dioxide provided to an exemplary thickness of from 700 Angstroms to 1,100 Angstroms. Transistor gate 14 comprises at least a semiconductive material and a conductive metal. In the context of this document, a "metal" includes any of an elemental metal, an alloy of at least two elemental metals, and metal compounds whether stoichiometric or not stoichiometric. Example preferred metals include W, Pt, Co, Mo, Pd, Cu, Al, Ta, Ti, WN, and conductive metal oxides, by way of example only. Further by way of example only, exemplary semiconductive materials include conductively doped silicon, for example polysilicon.

The exemplary embodiment transistor gate 14 is illustrated as comprising three layers 20, 22 and 24. An exemplary material 20 is conductively doped polysilicon deposited to an exemplary thickness of from 250 Angstroms to 750 Angstroms. An exemplary material for layer 22 is tungsten nitride provided in a 1:1 atomic ratio of tungsten to nitrogen, and to an exemplary thickness range of from 80 Angstroms to 100 Angstroms. An exemplary preferred material for layer 24 is elemental tungsten deposited to an exemplary thickness range of from 200 Angstroms to 400 Angstroms.

The illustrated layers 16, 20, 22, 24 and 18 would typically be successively formed over a substrate and then collectively patterned to form the illustrated gate construction 10, for example by photolithography and etch. FIG. 1 depicts source/drain regions 26 and 28 being formed proximate transistor gate 14. In the context of the illustrated preferred embodiment and invention, the formation of the source/drain regions at this point in the process might be only partial or might be complete. For example, source/drain regions of field effect transistors typically include multiple different concentration, and sometimes even conductivity type, implants. Examples include LDD, primary highest dose implants, halo regions, etc. Typical exemplary methods of forming such regions include ion implantation, gas dopant diffusion, and out-diffusion from adjacent solid materials. In the context of this document, any degree of formation of the source/drain regions is contemplated, whether partial or complete, and whether by any existing or yet-to-be developed processes. Further and by way of example only, some, all or none of gate dielectric layer 16 might be removed laterally outside of the pattern depicted by gate construction 10 prior to one or more of the processing which results in the partial or complete formation of the source/drain regions.

In a first implementation, transistor gate 14 and source/drain regions 26, 28 are exposed to a gas mixture comprising $H_2O$, $H_2$, a noble gas (meaning one or more noble gases), and $N_2$ under conditions effective to oxidize outer surfaces of the source/drain regions, with the $N_2$ being present in the gas mixture at greater than 0% and less than or equal to 20.0% by volume. FIG. 2 depicts a preferred result in the formation of oxide layers 30 and 32 over source/drain regions 26 and 28. Such rounds the outer lateral edges of gate oxide layer 16, and oxidizes the polysilicon sidewalls forming oxide regions 40. In one preferred embodiment, the $N_2$ is present in the gas mixture at greater than 0% and less than or equal to 10.0% by volume. Further most preferably, the $N_2$ is present in the gas mixture at greater than 1.0% by volume. Alternate exemplary maximum preferred $N_2$ concentrations include less than or equal to 5.0% by volume and less than or equal 3.5% by volume. For example, where the conductive metal of the gate comprises at least one of Pd, Cu and Al in elemental or alloy form, a preferred concentration range for $N_2$ is from greater than 0% to less than or equal to 5.0% by volume. For Pt, Co and Mo in elemental or alloy form, a preferred concentration of $N_2$ in the gas mixture is at greater than 0% and less than or equal to 3.5% by volume. Preferred noble gases include one or more of Ar, He, Ne and Kr. Other additional inert gases could of course be utilized.

An exemplary preferred temperature range is from 750° C. to 1050° C. More preferred is a temperature range of from 850° C. to 950° C., with from 885° C. to 915° C. being even more preferred. The conditions can include a pressure which is below, at or above room ambient pressure. Where the transistor gate comprises conductively doped polysilicon, WN and an elemental tungsten layer, for example as described above with respect to gate construction 14, an exemplary preferred concentration of $N_2$ in the gas mixture is at greater than 0% and less than or equal to 20% by volume.

The preferred conditions preferably comprise a volumetric ratio of $H_2O$ to $H_2$ of from 1:1 to 1:20, more preferably of from 1:2 to 1:4, and even more preferably from 1:2.7 to 1:2.8. Such $H_2O$:$H_2$ ratios are expected to provide the greatest selectivity in the formation of the oxide over a silicon surface as compared to a tungsten surface, for example which might be desirable in certain processing aspects where such materials are utilized. A preferred volumetric ratio of $H_2$ to the sum of $H_2O$ divided by 10, plus Ar divided by 10, plus $N_2$ divided by 25, is less than or equal to 1.0.

As further background, a prior art transistor fabrication method involving source/drain region re-oxidation had a gas mixture which was $H_2O$, $H_2$ and $N_2$ in a volumetric ratio of 1:2.75:27.5. No noble gas was utilized. Chamber pressure was 250 Torr, while chamber temperature was 900° C. The substrate was essentially as depicted in FIG. 1 prior to the re-oxidation. Oxide growth on the source/drain regions was at a rate of 0.18 Angstroms/minute. Unfortunately, such also resulted in the $N_2$ apparently reacting with and/or forcing nitrogen out of the tungsten nitride layer 22 and into or at the polysilicon of layer 20, forming an undesired resistive silicon nitride layer at the interface of tungsten nitride layer 22 and polysilicon layer 20. $N_2$ would otherwise be a desirable inert gas, due to its ability to reduce the formation of suicides as compared to other noble gases where it is desirable that silicide formation be reduced or eliminated. A mixture of $N_2$ and a noble gas (including more than one noble gas) may be desirable and provide an advantage of minimizing both suicide formation and silicon nitride formation within the gate stack. In certain aspects of the invention, the transistor gate is preferably substantially void of silicide before and after the exposing.

Reduction-to-practice examples included processing within ASM A400 and A412 thermal processors. Any other processor, or processor type, whether existing or yet to be developed, is also of course contemplated. The volume of the A400 reactor is about 80 liters, while that of the A412 reactor is about 140 liters. One hundred twenty five (125) wafers, 100 of which would be production wafers, were retained in the A400 reactor, while 195 wafers, 175 of which would be production wafers, were retained in the A412 reactor. Chamber temperatures were 900° C. and the gas flow mixtures were $H_2O$:$H_2$:Ar:$N_2$ at 1:2.75:24.75:6.875 by volume, thereby providing a 19% by volume $N_2$ concentration. Chamber pressure was maintained at 685 Torr, while room ambient pressure was 680 Torr. An oxide layer 30/32 of a thickness of 40 Angstroms resulted after processing for 19 minutes and 22 seconds, thus providing a growth rate of about 2.1 Angstroms/minute.

In accordance with a second implementation, a transistor fabrication method includes forming a transistor gate comprising semiconductor material and conductive metal. Source/drain regions are formed proximate the transistor gate. Any of the processing described above with respect to transistor gate and source/drain region formation can be and preferably is utilized. Regardless, the transistor gate and source/drain regions are exposed to a gas mixture comprising $H_2O$, $H_2$ and an inert gas (of course including multiple inert gases) under conditions effective to oxidize the outer surfaces of the source/drain regions, where the conditions comprise a pressure of greater than room ambient pressure. This implementation is independent of whether the inert gas comprises $N_2$ and one or more noble gases of the above-described first implementation, but could of course also include a combination of one or more noble gases and $N_2$. Yet in certain aspects of the invention, conditions might be void of any detectable $N_2$ in the gas mixture.

In one preferred embodiment, the pressure is no greater than 1.015 times room ambient pressure in Torr, and more preferably no greater than 1.0075 times room ambient pressure in Torr. With respect to the first implementation, the above-described example can also be considered in conjunction with and exemplary of this second implementation wherein the pressure of 685 Torr, in comparison to the room ambient pressure of 680 Torr, was 1.0074 times room ambient pressure in Torr. A preferred reason for operating at such pressures only slightly elevated from ambient room pressure is to preclude room ambient oxygen from entering the chamber in the event of a leak, which might introduce processing variability and/or safety issues. Further, operating at such preferred slightly elevated pressures enables such processing advantages while using processing equipment primarily designed to operate at room ambient pressure conditions.

However, other aspects of this implementation also constitute pressures greater than or equal to 1.015 times room ambient pressure in Torr. By way of example only, other preferred conditions include greater than or equal to 1.5 atmospheres; greater than or equal to 2.0 atmospheres; greater than or equal to 4.0 atmospheres; greater than or equal to 5.0 atmospheres; greater than or equal to 10.0 atmospheres; and greater than or equal to 15.0 atmospheres.

Further, also contemplated and preferred are any of the exposing conditions described above with respect to the first implementation.

In a third implementation, a transistor fabrication method includes forming a transistor gate comprising semiconductive material and conductive metal. Source/drain regions are formed proximate the transistor gate. Any of the above processing described with respect to the first described implementation transistor gate and source/drain region formation is also contemplated and preferred in accordance with this implementation of aspects of the invention. Regardless, the transistor gate and source/drain regions are exposed to a gas mixture comprising $H_2O$, $H_2$ and an inert gas (including multiple inert gases) under conditions effective to oxidize the outer surfaces of the source/drain regions at an oxide forming reaction rate of at least 0.20 Angstroms/minute, where a volumetric ratio of all inert gas to $H_2$ is at least 10:1. To the best of the inventor's understanding, such has not heretofore been achieved or achievable in the prior art. By way of example only and not of limitation, a preferred reason for achieving such reaction rate is to facilitate throughput of the circuitry being fabricated as well as to minimize thermal exposure of the substrates being processed. This just-described third implementation is also independent of whether the inert gas comprises a mixture of $N_2$ and one or more noble gases, and is independent of whether the conditions include a pressure of greater than room ambient pressure.

In one preferred implementation, the reaction rate in oxidizing the outer surfaces of the source/drain regions to form oxide is at a rate of at least 1.0 Angstroms/minute, and more preferably at a rate of at least 2.0 Angstroms/minute. In one preferred implementation where the inert gas is at least 99% $N_2$ by volume, the inert gas to $H_2$ volumetric ratio is preferably at least 25:1. Also contemplated and preferred are any of the exposing conditions described above with respect to the first and second implementations. Preferred noble gases again include one or more of Ar, He, Ne and Kr.

In accordance with each of the above-described second and third implementations, exemplary reduction-to-practice examples also included processings in ASM A400 and A412 processors. The processing temperature was 900° C. and processing pressure was 685 Torr, with ambient room pressure being 680 Torr. A gas mixture provided during the process was $H_2$:$H_2O$:Ar at a volumetric ratio of 1:2.75:27.5. Oxide layers 30/32 resulted had a thickness of 40 Angstroms after 17 minutes and 21 seconds, providing a reaction rate of 2.3 Angstroms/minute.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A transistor fabrication method, comprising:

forming a transistor gate comprising polysilicon and conductive metal;

forming source/drain regions proximate the transistor gate; and exposing the transistor gate and source/drain regions to a gas mixture comprising $H_2O$, $H_2$, a noble gas and $N_2$ under conditions effective to oxidize outer surfaces of the source/drain regions, the $N_2$ being present in the gas mixture at greater than 0% and less than or equal to 20.0% by volume.

2. The method of claim 1 wherein the polysilicon is conductively doped.

3. The method of claim 1 wherein the conditions comprise:

a volumetric ratio of a:b of at least 10:1, where "a" is a sum of volumes of all noble gas and $N_2$, and "b" is volume of $H_2$; and a reaction rate in oxidizing the outer surfaces of the source/drain regions to form oxide at a rate of at least 0.20 Angstroms/minute.

4. A transistor fabrication method, comprising:

forming a conductive portion of a transistor gate comprising at least two conductive material layers, one of the conductive material layers comprising conductively doped polysilicon and another of the conductive material layers comprising conductive metal;

forming source/drain regions proximate the transistor gate; and exposing the transistor gate and source/drain regions to a gas mixture comprising $H_2O$, $H_2$, a noble gas and $N_2$ under conditions effective to oxidize outer surfaces of the source/drain regions, the $N_2$ being present in the gas mixture at greater than 0% and less than or equal to 20.0% by volume.

5. The method of claim 4 comprising forming the conductive portion of the transistor gate to comprise at least three conductive material layers.

6. The method of claim 4 wherein the conductive metal comprises a metal compound, and wherein the conductive portion comprises an additional conductive material layer comprising at least one metal in elemental form.

7. A transistor fabrication method, comprising:

forming transistor source/drain regions on a semiconductor substrate; and exposing the source/drain regions to a gas mixture comprising $H_2O$, $H_2$, a noble gas and $N_2$ under conditions effective to oxidize outer surfaces of the source/drain regions, the $N_2$ being present in the gas mixture at greater than 0% and less than or equal to 20.0% by volume; and providing a transistor gate comprising semiconductive material and conductive metal on the semiconductor substrate intermediate the transistor source/drain regions.

8. The method of claim 7 wherein the semiconductive material is conductively doped.

9. The method of claim 7 wherein said providing occurs prior to said exposing.

10. A transistor fabrication method, comprising:

forming a transistor gate comprising polysilicon and conductive metal;

forming source/drain regions proximate the transistor gate; and exposing the transistor gate and source/drain regions to a gas mixture comprising $H_2O$, $H_2$, and an inert gas under conditions effective to oxidize outer surfaces of the source/drain regions, the conditions comprising a pressure of greater than room ambient pressure.

11. The method of claim 10 wherein the polysilicon is conductively doped.

12. The method of claim 10 wherein the conditions comprise:

a volumetric ratio of all inert gas to $H_2$ of at least 10:1; and a reaction rate in oxidizing the outer surfaces of the source/drain regions to form oxide at a rate of at least 0.20 Angstroms/minute.

13. A transistor fabrication method, comprising:

forming a conductive portion of a transistor gate comprising at least two conductive material layers, one of the conductive material layers comprising conductively doped polysilicon and another of the conductive material layers comprising conductive metal;

forming source/drain regions proximate the transistor gate; and exposing the transistor gate and source/drain regions to a gas mixture comprising $H_2O$, $H_2$, and an inert gas under conditions effective to oxidize outer surfaces of the source/drain regions, the conditions comprising a pressure of greater than room ambient pressure.

14. The method of claim 13 comprising forming the conductive portion of the transistor gate to comprise at least three conductive material layers.

15. The method of claim 13 wherein the conductive metal comprises a metal compound, and wherein the conductive portion comprises an additional conductive material layer comprising at least one metal in elemental form.

16. A transistor fabrication method, comprising:

forming transistor source/drain regions on a semiconductor substrate; and exposing the source/drain regions to a gas mixture comprising $H_2O$, $H_2$, and an inert gas under conditions effective to oxidize outer surfaces of the source/drain regions, the conditions comprising a pressure of greater than room ambient pressure; and providing a transistor gate comprising semiconductive material and conductive metal on the semiconductor substrate intermediate the transistor source/drain regions.

17. The method of claim 16 wherein the semiconductive material is conductively doped.

18. The method of claim 16 wherein said providing occurs prior to said exposing.

19. A transistor fabrication method, comprising:

forming a transistor gate comprising polysilicon and conductive metal;

forming source/drain regions proximate the transistor gate; and exposing the transistor gate and source/drain regions to a gas mixture comprising $H_2O$, $H_2$, and an inert gas under conditions effective to oxidize outer surfaces of the source/drain regions at an oxide forming reaction rate of at least 0.20 Angstroms/minute where a volumetric ratio of all inert gas to $H_2$ is at least 10:1.

20. The method of claim 19 wherein the polysilicon is conductively doped.

21. A transistor fabrication method, comprising:

forming a conductive portion of a transistor gate comprising at least two conductive material layers, one of the conductive material layers comprising conductively doped polysilicon and another of the conductive material layers comprising conductive metal;

forming source/drain regions proximate the transistor gate; and exposing the transistor gate and source/drain regions to a gas mixture comprising $H_2O$, $H_2$, and an inert gas under conditions effective to oxidize outer surfaces of the source/drain regions at an oxide forming reaction rate of at least 0.20 Angstroms/minute where a volumetric ratio of all inert gas to $H_2$ is at least 10:1.

22. The method of claim 21 comprising forming the conductive portion of the transistor gate to comprise at least three conductive material layers.

23. The method of claim 21 wherein the conductive metal comprises a metal compound, and wherein the conductive portion comprises an additional conductive material layer comprising at least one metal in elemental form.

24. A transistor fabrication method, comprising:

forming transistor source/drain regions on a semiconductor substrate; and exposing the source/drain regions to a gas mixture comprising $H_2O$, $H_2$, and an inert gas under conditions effective to oxidize outer surfaces of the source/drain regions at an oxide forming reaction rate of at least 0.20

Angstroms/minute where a volumetric ratio of all inert gas to $H_2$ is at least 10:1; and providing a transistor gate comprising semiconductive material and conductive metal on the semiconductor substrate intermediate the transistor source/drain regions.

25. The method of claim 24 wherein the semiconductive material is conductively doped.

26. The method of claim 24 wherein said providing occurs prior to said exposing.

* * * * *

UNITED STATES PATENT AND TRADEMARK OFFICE

CERTIFICATE OF CORRECTION

PATENT NO. : 7,015,151 B2
APPLICATION NO. : 11/089714
DATED : March 21, 2006
INVENTOR(S) : Don C. Powell It is certified that error appears in the above-identified patent and that said Letters Patent is hereby corrected as shown below:

Cover Page (54) Title
Replace "TRANSISTOR FABRICATION METHODS COMPRISING SELECTIVE WET OXIDATION"
Replace with --TRANSISTOR FABRICATION METHODS--

Col. 1, lines 1-3
Replace "TRANSISTOR FABRICATION METHODS COMPRISING SELECTIVE WET OXIDATION"
Replace with --TRANSISTOR FABRICATION METHODS--

Col. 1, after Related Patent Data
Insert --TECHNICAL FIELD--
Insert --This invention relates to transistor fabrication methods.--

Signed and Sealed this

Sixth Day of March, 2007

JON W. DUDAS
*Director of the United States Patent and Trademark Office*